US008629513B2

(12) United States Patent
Su et al.

(10) Patent No.: US 8,629,513 B2
(45) Date of Patent: Jan. 14, 2014

(54) HV INTERCONNECTION SOLUTION USING FLOATING CONDUCTORS

(75) Inventors: Ru-Yi Su, Kouhu Township (TW); Fu-Chih Yang, Fengshan (TW); Chun-Lin Tsai, Hsin-Chu (TW); Ker Hsiao Huo, Taichung (TW); Chih-Chang Cheng, Hsin-Chu (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 217 days.

(21) Appl. No.: 13/007,220

(22) Filed: Jan. 14, 2011

(65) Prior Publication Data

US 2012/0181629 A1    Jul. 19, 2012

(51) Int. Cl.
*H01L 29/78* (2006.01)

(52) U.S. Cl.
USPC .................................. 257/409; 257/E29.009

(58) Field of Classification Search
USPC .......................................... 257/409, E29.009
See application file for complete search history.

(56) References Cited

U.S. PATENT DOCUMENTS

| 6,110,804 A | 8/2000 | Parthasarathy | |
| 6,879,005 B2 * | 4/2005 | Yamaguchi et al. | .......... 257/367 |
| 7,095,092 B2 | 8/2006 | Zhu et al. | |
| 7,973,382 B2 * | 7/2011 | Takahashi | ..................... 257/487 |
| 2005/0194656 A1 * | 9/2005 | Shimizu | ........................ 257/488 |
| 2008/0299751 A1 * | 12/2008 | Quddus et al. | ................ 438/571 |

OTHER PUBLICATIONS

Kim, S.L., et al., "Realization of Robust 600V High Side Gate Drive IC with a New Isolated Self-Shielding Structure," Proceedings of the 17th International Symposium on Power Semiconductor Decvices & IC's, May 23-26, 2005, Santa Barbara, CA, IEEE, 4 pgs.

Yamaji, M., et al., "A Novel 600V-LDMOS with HV-Interconnection for HVIC on Thick SOI," Proceedings of the 22nd International Symposium on Power Semiconductor Decices & IC's, Jun. 6-10, 2010, Hiroshima, IEEE, 4 pgs.

* cited by examiner

*Primary Examiner* — Phat X Cao
(74) *Attorney, Agent, or Firm* — Slater & Matsil, L.L.P.

(57) ABSTRACT

A device includes a first and a second heavily doped region in a semiconductor substrate. An insulation region has at least a portion in the semiconductor substrate, wherein the insulation region is adjacent to the first and the second heavily doped regions. A gate dielectric is formed over the semiconductor substrate and having a portion over a portion of the insulation region. A gate is formed over the gate dielectric. A floating conductor is over and vertically overlapping the insulation region. A metal line includes a portion over and vertically overlapping the floating conductor, wherein the metal line is coupled to, and carries a voltage of, the second heavily doped region.

14 Claims, 7 Drawing Sheets

US 8,629,513 B2

HV INTERCONNECTION SOLUTION USING FLOATING CONDUCTORS

BACKGROUND

Ultra-high voltage (UHV) metal-oxide-semiconductor (MOS) devices were typically fabricated with coplanar drain and source regions. A common problem observed in the UHV MOS devices is the difficulty in the improvement of breakdown voltages. This not only posts limitations to the application of the UHV MOS devices, but also adversely affects the reliability of the UHV MOS devices.

In one of the applications of the UHV MOS devices, UHV MOS devices are used to form a level shifter, which generates a high voltage. The high voltage may be provided to a high-side gate driver, which may operate at the voltage range between 0 to 600V, for example. Accordingly, the level shifter needs to generate a voltage as high as 600V by pushing up a low source voltage, for example, 5V. In this circuit, the breakdown voltage of the entire circuit not only depends on the breakdown voltage of individual UHV MOS devices, but also depends on the breakdown voltage of the interconnection structures for conducting the high voltages.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel high-voltage interconnect structure is provided in accordance with an embodiment. The variations and the operation of the embodiment are then discussed. Throughout the various views and illustrative embodiments, like reference numbers are used to designate like elements.

Figure 1:
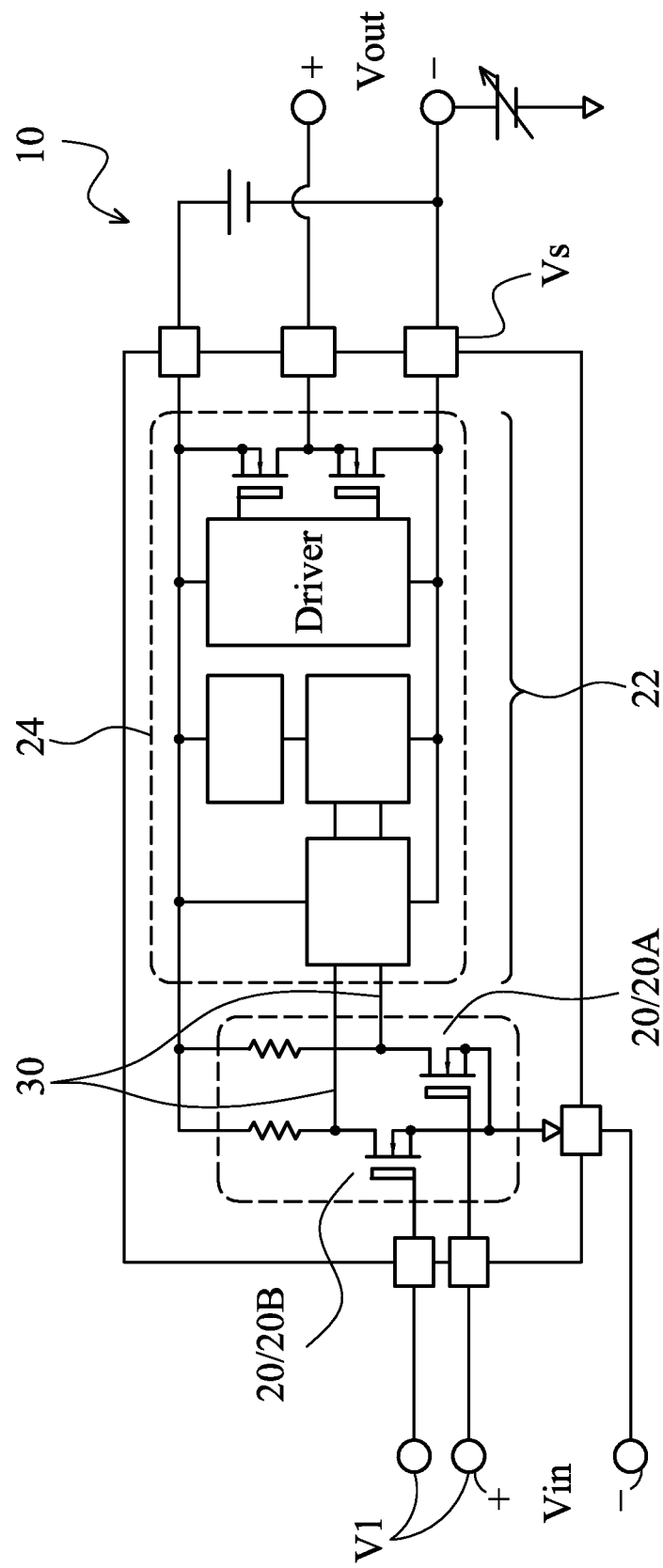
FIG. 1 illustrates a block diagram illustrates a half bridge circuit configured to provide a high voltage.

FIG. 1 illustrates ultra-high voltage (UHV) generating circuit 10 for generating an ultra-high voltage, which may be about 600V or even greater, although the ultra-high voltage may also be lower. UHV generating circuit 10 includes UHV MOS devices 20 (denoted as 20A and 20B), which may be, for example, lateral-diffusion MOS (LDMOS) devices. UHV MOS devices 20 may be asymmetric devices, whose source sides and drain sides have an asymmetric structure. Alternatively, UHV MOS devices 20 may be symmetric devices, whose source sides have symmetric structures as their respective drain sides. UHV MOS devices 20 are part of a level shifter that is configured to push up low power supply voltage V1, which may be, for example, 5V. The resulting drain voltages on the drains of UHV MOS devices 20 may be as high as 600V, for example. The high drain voltages are provided to high-side gate driver 22. Ultra-high voltage (UHV) generating circuit 10 is configured to output voltage Vout, which may range between 0V and 20V when voltage Vs ranges between 0V and 600V. UHV generating circuit 10 further includes high-side control part 24, which includes a high-voltage diode that can sustain the UHV provided by the level shifter. The devices in high-side gate driver 22, such as the driver circuit, may be formed in the region encircled by high-side control part 24. The UHV generated by the level shifter is provided to high-side gate driver 22 through high-voltage (HV) interconnection 30, which includes metal lines. Accordingly, HV interconnection(s) 30 cross over high-side control part 24.

Figure 2:
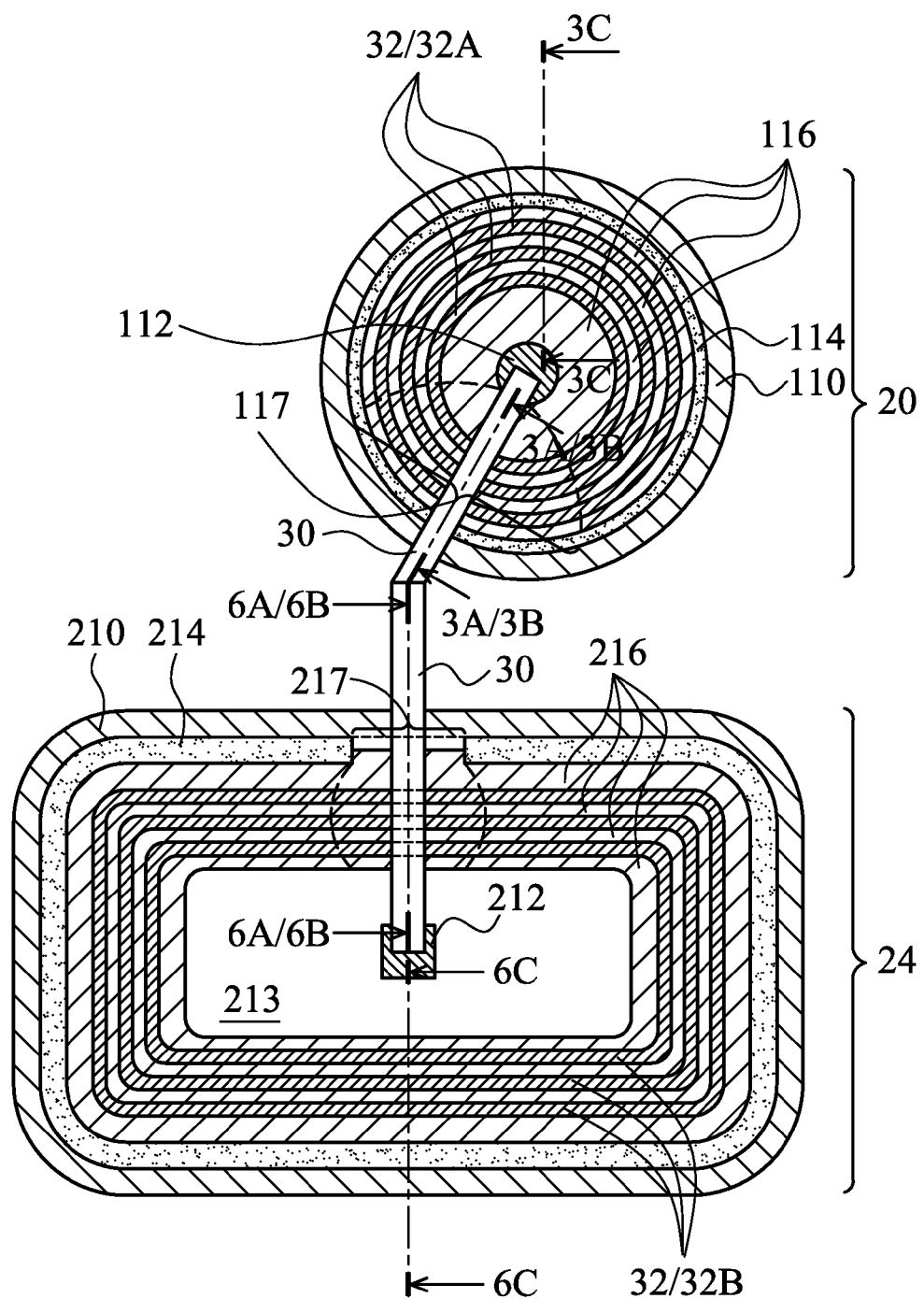
FIG. 2 schematically illustrates a top view of a ultra-high voltage (UHV) MOS device and a high-side control part of a high-side gate driver, wherein floating conductors are formed over a drain insulation region.

FIG. 2 illustrates a schematic top view of UHV MOS device 20, high-side control part 24, and the HV interconnection 30 for conducting the high voltage generated by UHV MOS device 20 into region 213 that is encircled by high-side control part 24. UHV MOS device 20 includes source 110, drain 112, gate 114, and drain insulation region 116. Source 110 and drain 112 may be doped with p-type or n-type impurities, depending on the conductivity type of UHV MOS device 20. In an embodiment, source 110 and drain 112 are n-type heavily doped regions, which may have n-type impurity concentrations between about $10^{19}/cm^3$ to about $10^{21}/cm^3$, for example. Further, drain insulation region 116 may be a field oxide region comprising silicon oxide, which may be formed through the thermal oxidation of silicon, or may be a shallow-trench isolation (STI) region.

In an embodiment, drain 112 is encircled by drain insulation region 116, which forms a ring. Drain insulation region 116 may further be encircled by source 110, which may also form a ring or a partial ring. Gate 114 has its inner portion (which is on the inner side of the ring formed of source 110) vertically overlapping (directly over) the outer portion of drain insulation region 116. Gate 114 forms a ring. Metal lines and vias (not shown) may be formed over and connected to gate 114. The metal lines and vias have break 117 formed therein. Alternatively stating, in break 117, no metal lines and vias are formed, while outside break 117, metal lines and via may be formed. HV interconnection 30 is connected to drain 112, and passes above and vertically overlapping break 117. HV interconnection 30 vertically overlaps gate 114.

Figure 3A:
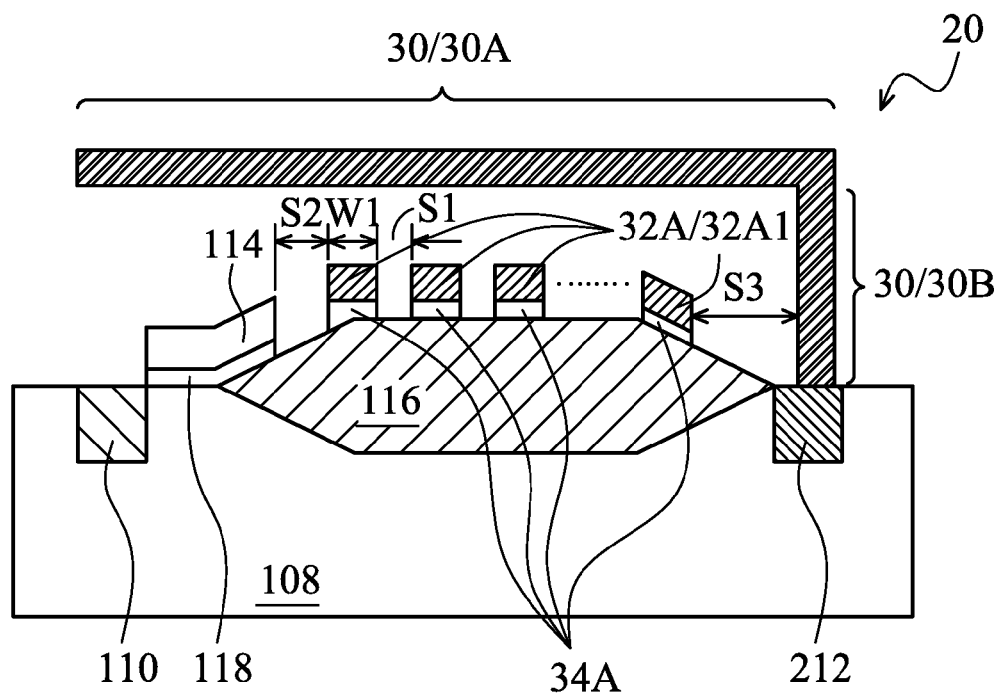
FIGS. 3A through 3C illustrate the cross-sectional views of the UHV MOS device as shown in FIG. 2.
Figure 3B:
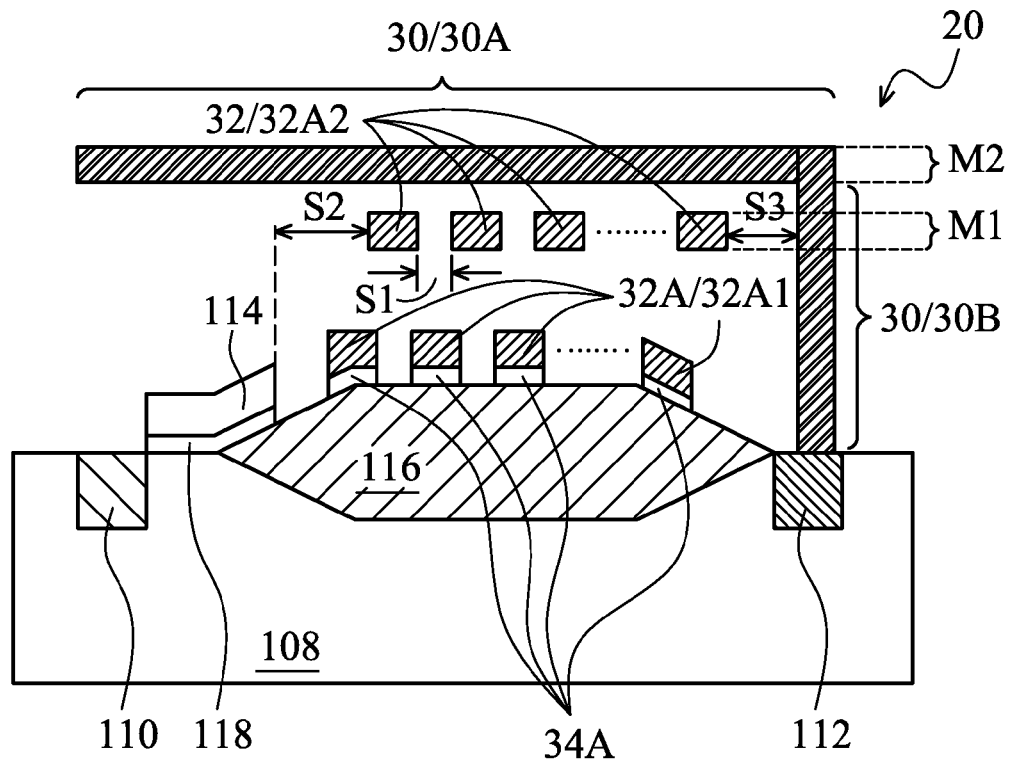
Figure 3C:
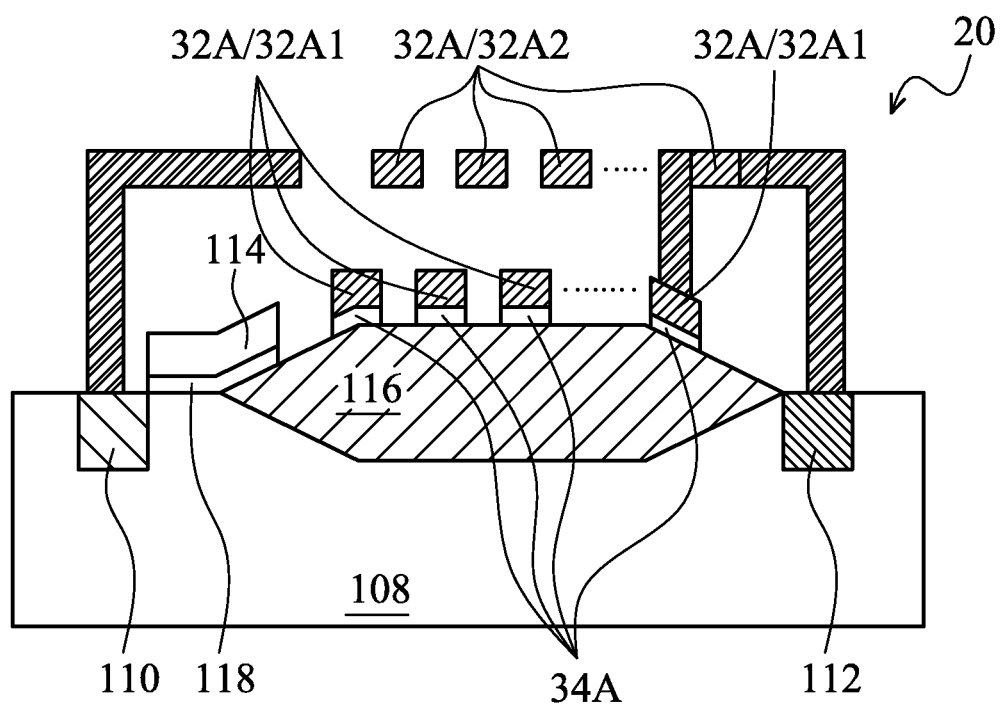
Figure 5:
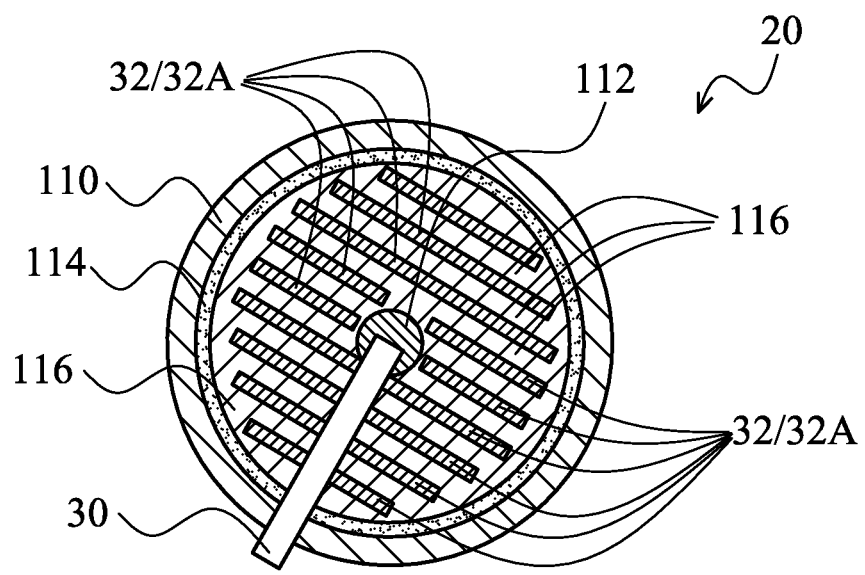

A plurality of floating conductors 32 (also denoted as 32A) is formed directly over and vertically overlapping drain insulation region 116 (also refer to FIGS. 3A through 3C). Floating conductors 32A may not be coupled to any device in the respective die and are not coupled to electrical ground, and hence are electrically floating during the operation of UHV MOS device 20. In an embodiment, as shown in FIG. 2, floating conductors 32A form a plurality of rings, which may be concentric rings having a common center overlapping the center of drain 112. In alternative embodiments, floating conductors 32 may have other patterns. For example, as shown in FIG. 5, floating conductors 32 may form parallel straight lines.

High-side control part 24 may also form a MOS structure including source 210, drain 212, gate 214, and drain insulation region 216. Source 210 may be doped with a p-type impurity, while drain 212 may be doped with an n-type impurity, although the conductivity type may also be reversed. Source 210 and gate 214 are interconnected (please refer to FIGS. 6A through 6C), so that high-side control part 24 forms a diode. Similarly, drain insulation region 216 may be a field oxide or an STI region, and may be formed simultaneously with drain insulation region 116.

In an embodiment, drain 212 is encircled by drain insulation region 216, which forms a ring. The region 213 encircled by drain insulation region 216 may be used to form the devices such as the driver of high-side gate driver 22 (FIG. 1). Furthermore, drain 212 may be spaced apart from drain insulation region 216. Drain insulation region 216 may further be encircled by source 210, which may form a ring or a partial ring. Gate 214 has its inner portion directly over, and overlapping, the outer portion of drain insulation region 216. Gate 214 forms a ring. Metal lines and vias (not shown) may be formed over and connected to gate 214. The metal lines and vias have break 217. Alternatively stating, in break 217, no metal lines and vias are formed, while outside break 217, metal lines and via may be formed. HV interconnection 30 interconnects drains 112 and 212, and passes over and vertically overlapping break 217. HV interconnection 30 may vertically overlap gate 214.

Figure 6A:
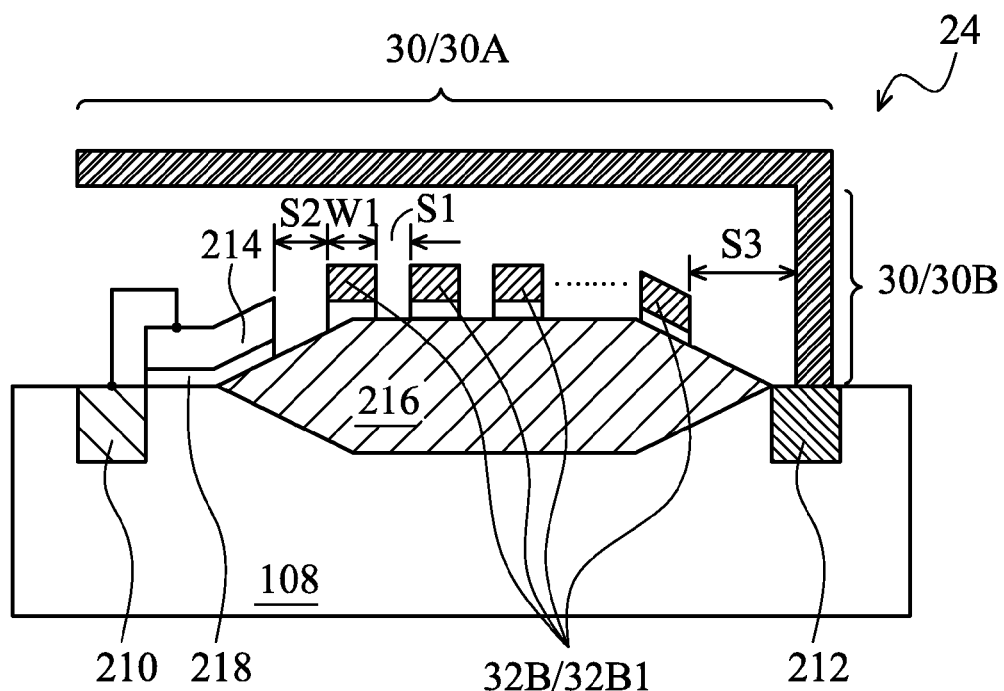
FIGS. 6A through 6C illustrate the cross-sectional views of the high-side control part as shown in FIG. 2.
Figure 6B:
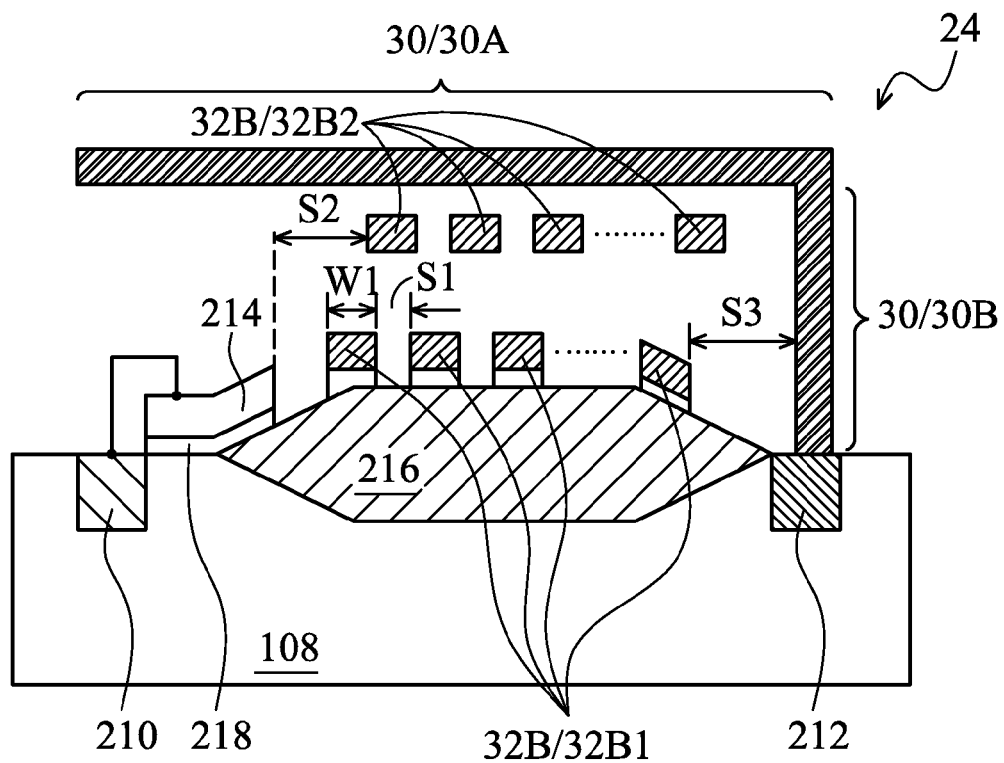
Figure 6C:
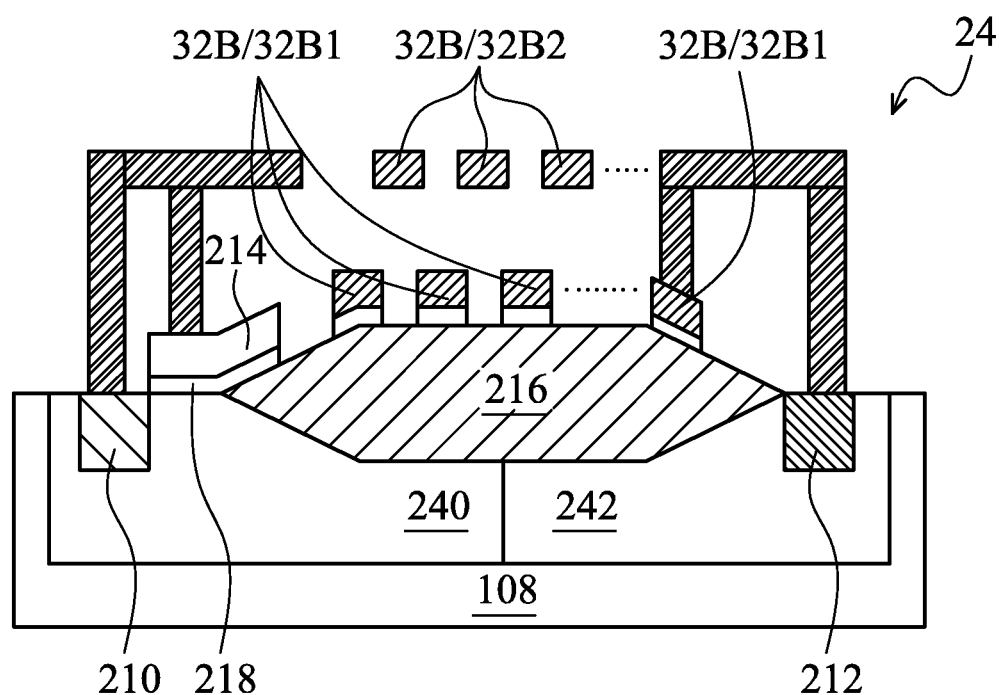

A plurality of floating conductors 32 (also denoted as 32B) is formed directly over, and vertically overlapping, drain insulation region 216 (also refer to FIGS. 6A through 6C). Floating conductors 32B may not be electrically coupled to any device in the respective die, and hence are electrically floating during the operation of UHV MOS device 20. In an embodiment, as shown in FIG. 2, floating conductors 32B form a plurality of rings with portions parallel to each other. In alternative embodiments, floating conductors 32B may form other patterns such as parallel straight lines (not shown) similar to the pattern of floating conductors 32A in FIG. 5.

FIG. 3A illustrates a cross-sectional view of a portion of the structure shown in FIG. 2, wherein the cross-sectional view is obtained from the plane crossing line 3A/3B-3A/3B in FIG. 2. Source 110 and drain 112 may be formed in substrate 108. Additional regions such as high-voltage p wells and high-voltage n wells are not shown, although they may also exist under source 110, drain 112, and drain insulation region 116. In the illustrated plane, floating conductor 32A (also denoted as 32A1) includes a plurality of dummy gate electrodes, which may be formed simultaneously as gates 114. In an embodiment, floating conductors 32A1 and gate 114 are formed of polysilicon, and hence floating conductors 32A1 are also referred to as floating poly lines. Dielectric layers 34A may be formed under floating conductors 32A1, wherein dielectric layers 34A may be formed simultaneously, and comprising the same material, as gate dielectric 118. In an embodiment, dielectric layers 34A and gate dielectric 118 are formed of silicon oxide.

FIG. 3B also illustrates a cross-sectional view of a portion of the structure shown in FIG. 2 in accordance with alternative embodiments, wherein the cross-sectional view is obtained from the plane crossing line 3A/3B-3A/3B in FIG. 2. Floating conductors 32A (denoted as 32A2) are in the form of floating metal lines. In an embodiment, floating metal lines 32A2 are formed in a metal layer as a part of interconnect structure of the respective die. Floating metal lines 32A2 may be lower than the metal layer of HV interconnection 30 by one or more metal layer. Furthermore, floating metal lines 32A2 extends to directly under and overlapping at least a portion (marked as 30A) of HV interconnection 30. HV interconnection 30 may be electrically connected to drain 112, and hence is an HV-carrying metal line. In an embodiment, HV interconnection 30 includes metal line portion 30A in the second metal line (M2), and hence floating metal lines 32A2 are in the first metal line (M1, which is the bottom metal layer) that is immediately over the dielectric layer (inter-level dielectric (ILD)). In alternative embodiments, metal line potion 30A may be in the metal layer high than M2, and may be in the third metal layer (M3, not shown), the fourth metal layer (M4, not shown), or the like. Furthermore, floating metal lines 32A2 may be formed in one, some, or all, of the metal layers that are under metal line portion 30A. Although not shown in the Figures, passivation layers may be formed over HV interconnection 30.

The density of floating conductors 32 as shown in FIGS. 3A and 3B may be high. In an embodiment, widths W1 of floating conductors 32 are less than two times, or may be substantially equal to, the minimum width that is allowed by the forming technology of the respective dies/wafers. For example, in 0.5 μm technology, the minimum width may be about 0.5 μm for polysilicon lines and about 0.6 μm for the metal lines in metal layer M1. Also, the spacing S1 between floating conductors 32 may be less than two times, or may be substantially equal to, the minimum spacing (as specified by minimum rule) allowed by the forming technology of the respective dies/wafers. For example, in 0.5 μm technology, the minimum spacing S1 may be about 0.6 μm for polysilicon lines and about 0.6 μm for the metal lines in metal layer M1. The spacing S2 between floating conductors 32 and gate 114, and spacing S3 between floating conductors 32 and drain 112 (or the respective vertical portion 30B of HV interconnection 30) may also be less than two times, or may be substantially equal to, the minimum spacing. Small width W1 and small spacings S1, S2, and S3 are beneficial for increasing the breakdown voltages of the respective UHV MOS device 20 and high-side control part 24, and hence are beneficial for increasing the breakdown voltages of HV interconnection 30.

In various other embodiments, as also shown in FIG. 3B, floating conductors 30 include both floating poly lines 32A1 and floating metal lines 32A2. In an embodiment, floating metal lines 32A2 overlie, and vertically overlap, the spaces between floating poly lines 32A1, and floating poly line 32A1 may underlie and vertically overlap the spaces between floating metal lines 32A2. In alternative embodiments, floating metal lines 32A2 and floating poly lines 32A1 may be partially, or fully, overlap. In the embodiments both floating poly line 32A1 and floating metal lines 32A2 exist, the top view in FIG. 2 may represent floating poly line 32A1 and/or floating metal lines 32A2.

FIG. 3C illustrates a cross-sectional view of the structure shown in FIG. 2, with the cross-sectional view obtained from the plane crossing line 3C-3C in FIG. 2. This embodiment is similar to the embodiment shown in FIG. 3A. Similarly, floating poly lines 32A1 and/or floating metal lines 32A2 may be formed in this plane and vertically overlapping drain insulation region 116. In an embodiment, as shown in FIG. 3C, drain 112 may be connected to a polysilicon line, which is directly over drain insulation region 116, to help release electrical field.

Figure 4:
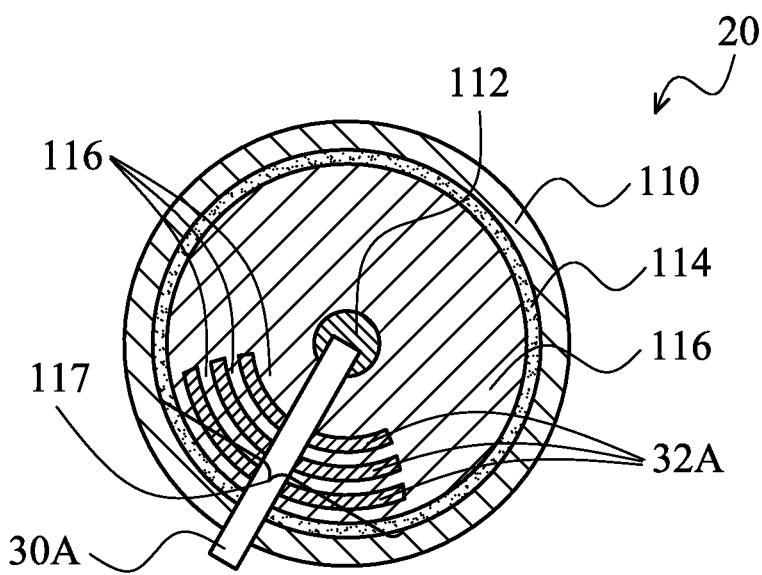
FIGS. 4 and 5 illustrate the top views of UHV MOS devices in accordance with various alternative embodiments.

In some embodiments, floating conductors 30 are distributed over substantially an entirety of the available spaces that are over drain insulation region 116. FIG. 4 illustrates a circuit structure in accordance with an alternative embodiment, wherein floating conductors 30 are formed in a region directly under metal line portion 30A of HV interconnection 30 and the adjacent regions, and are not formed in regions that are farther away from metal line 30A. For example, in the exemplary embodiments in FIG. 4, floating conductors 30 are formed close to break 117, while are not formed in other regions such as the regions on opposite side of drain 112. In the illustrated embodiments, a half or more (such as three quarters) of the ring formed of drain insulation region 116 has floating conductors 32A distributed over it, while the rest of the insulation region 116 does not.

FIG. 6A illustrates a cross-sectional view of high-side control part 24 as shown in FIG. 2, with the cross-sectional view obtained from the plane crossing line 6A/6B-6A/6B in FIG. 2. The illustrated portion includes heavily doped P+ source 210 and heavily doped N+ drain 212. In an embodiment, floating conductors 32B include floating poly line 32B1 that are formed directly over, and vertically overlapping, drain insulation region 216. Floating conductors 32B1 may be formed simultaneously, and hence formed of the same material as, floating conductors 32A1 (FIG. 3A) and gate 214. The details regarding floating conductors 32B1, such as the respective width W1, spacings S1, S2, and S3, and the density and the respective distribution may be essentially the same as that of floating conductors 32A1 as shown in FIG. 3A.

FIG. 6B illustrates a cross-sectional view in accordance with an alternative embodiment, wherein the cross-sectional view is also obtained from the plane crossing line 6A/6B-6A/6B in FIG. 2. In this embodiment, floating conductors 32B include floating metal lines 32B2, which are formed directly over, and vertically overlapping, drain insulation region 216. In addition to floating metal lines 32B2, floating poly lines 32B1 may also be formed. The specifications and the details of floating poly lines 32B1 and floating metal lines 32B2 may be essentially the same as floating poly lines 32A1 and floating metal lines 32A2 (FIG. 3B), respectively, and hence are not repeated herein. Gate 214 is electrically connected to source 210, wherein the connection may be through contact plugs and a metal line (not shown).

FIG. 6C illustrates a cross-sectional view of high-side control part 24 as shown in FIG. 2, with the cross-sectional view obtained from the plane crossing line 6C-6C in FIG. 2. Gate 214 extends into this plane. Gate 214 is electrically connected to source 210 through metal lines and vias, as illustrated, and hence the respective high-side control part 24 comprises a diode with source 210 forming a part of the anode, and drain 212 forming a part of the cathode. In an embodiment, the diode includes HV p well 240 under source 210 and HV n well 242 under drain 212, which wells form a p-n junction. One skilled in the art will realize that the diode may have various other designs. Gate 214 partially overlaps drain insulation region 216, and gate dielectric 218 is formed under gate 214. In an embodiment, drain 212 may be connected to a polysilicon line, which is directly over drain insulation region 216, to help release electrical field.

Figure 7:
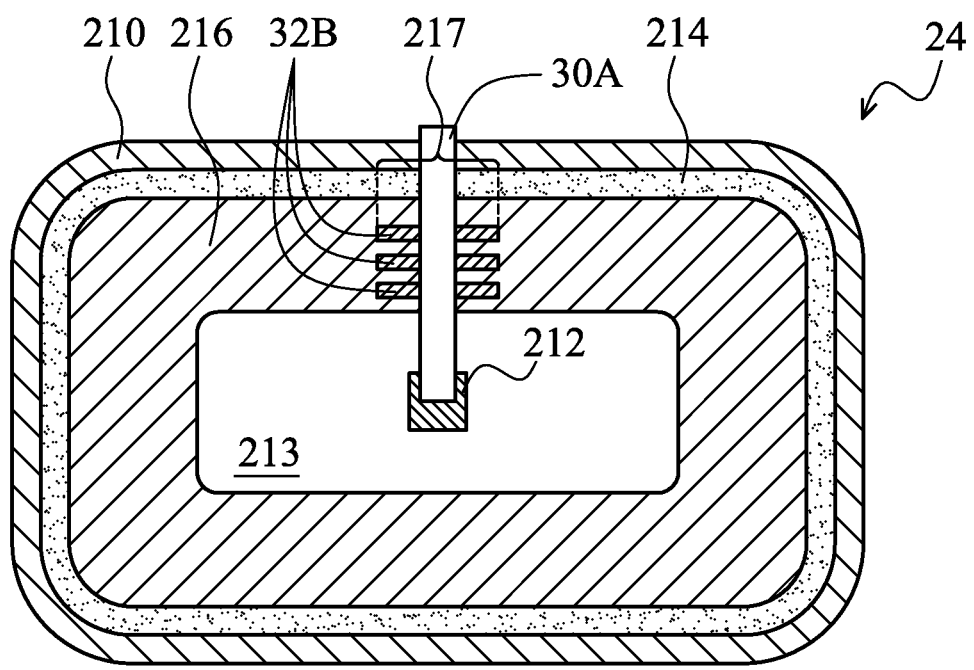
FIG. 7 illustrates the top view of a high-side control part in accordance with alternative embodiments.

FIG. 7 illustrates an alternative embodiment, wherein floating conductors 32B are not formed as closed rings. Rather, floating conductors 32B are formed in the regions that are directly under HV interconnection portion 30A and the adjacent regions, but not in other regions that are not directly under HV interconnection portion 30A. For example, floating conductors 32B may be formed close to break 217 and in the ring formed of gate 214.

In the embodiments, by forming floating conductors directly over the drain insulation regions and under the HV interconnections, the breakdown voltages of the respective devices can be increased. Experimental results obtained from sample wafers have shown that, if UHV MOS devices 20 is formed alone and high-side control part 24 is not formed, with the formation of floating conductors 32, the breakdown voltage of UHV MOS devices 20 (FIG. 2) may be increased from about 170V to about 820V. Furthermore, if device 24 is further formed along with UHV MOS devices 20, the breakdown voltage of the combined device including both devices 20 and 24 may be increased further from about 820V to about 960V.

In accordance embodiments, a device includes a first and a second heavily doped region in a semiconductor substrate. An insulation region has at least a portion in the semiconductor substrate, wherein the insulation region is adjacent to the first and the second heavily doped regions. A gate dielectric is formed over the semiconductor substrate and having a portion over a portion of the insulation region. A gate is formed over the gate dielectric. A floating conductor is over and vertically overlapping the insulation region. A metal line includes a portion over and vertically overlapping the floating conductor, wherein the metal line is coupled to, and carries a voltage of, the second heavily doped region.

In accordance with other embodiments, a HVMOS includes a source and a drain; a drain insulation region adjacent to the drain; and a gate adjacent to the source and having a portion extending over a portion of the drain insulation region. A floating conductor is formed over and vertically overlapping the drain insulation region. A metal line includes a portion over vertically overlapping a portion of the floating conductor. The metal line is coupled to the drain and carries a voltage of the drain.

In accordance with yet other embodiments, a high-voltage diode includes a source of p-type and a drain of n-type; a drain insulation region adjacent to the drain; and a gate adjacent to the source and comprising a portion extending over and vertically overlapping a portion of the drain insulation region. The gate is electrically connected to the source. A floating conductor is formed over and vertically overlapping the drain insulation region. A metal line includes a portion over and vertically overlapping a portion of the floating conductor. The metal line is coupled to a high-voltage device and receives a high voltage from the high-voltage device.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor substrate;
   a first and a second heavily doped region in the semiconductor substrate, wherein the first and the second heavily doped regions are of opposite conductivity types;
   an insulation region having at least a portion in the semiconductor substrate, wherein the insulation region is adjacent to the first and the second heavily doped regions;
   a gate dielectric over the semiconductor substrate and comprising a portion over a portion of the insulation region;

a gate over the gate dielectric, wherein the gate is electrically coupled to the first heavily doped region;

a floating conductor over and vertically overlapping the insulation region; and a metal line comprising a portion over and vertically overlapping the floating conductor, wherein the metal line is coupled to, and carries a voltage of, the second heavily doped region.

2. The device of claim 1, wherein the insulation region forms a first ring, and the floating conductor forms a second ring over the first ring.

3. The device of claim 1, wherein the floating conductor comprises polysilicon.

4. The device of claim 1, wherein the floating conductor comprises a metal, and is located in a metal layer at a level higher than the gate.

5. The device of claim 1 further comprising a plurality of floating conductors over and vertically overlapping the insulation region and electrically insulated from each other.

6. The device of claim 1, wherein the gate forms a ring.

7. A device comprising:

a high-voltage diode comprising a high-voltage MOS device, wherein the high-voltage MOS device comprises:

a source of p-type and a drain of n-type;

a drain insulation region adjacent to the drain; and a gate adjacent to the source and comprising a portion extending over and vertically overlapping a portion of the drain insulation region, wherein the gate is electrically connected to the source;

a floating conductor over and vertically overlapping the drain insulation region; and a metal line comprising a portion over and vertically overlapping a portion of the floating conductor, wherein the metal line is coupled to a high-voltage device and receives a high voltage from the high-voltage device, wherein the metal line is electrically coupled to, and has substantially a same voltage as, the drain of the high-voltage MOS device.

8. The device of claim 7, wherein the metal line is further connected to the drain of the high-voltage diode.

9. The device of claim 7, wherein the drain insulation region forms a first ring encircling the drain, and the floating conductor forms a second ring over and vertically overlapping the first ring.

10. The device of claim 7, wherein the floating conductor comprises polysilicon.

11. The device of claim 7, wherein the floating conductor comprises a metal.

12. The device of claim 7 further comprising a plurality of floating conductors over and vertically overlapping the drain insulation region and electrically insulated from each other.

13. The device of claim 12, wherein widths of the plurality of floating conductors are substantially equal to a minimum width allowed by a respective forming technology of the device, and wherein spacings of the plurality of floating conductors are substantially equal to a minimum spacing allowed by a respective forming technology of the device.

14. The device of claim 12, wherein the gate forms a ring.

* * * * *